(12) United States Patent
Smith et al.

(10) Patent No.: US 9,594,134 B2
(45) Date of Patent: Mar. 14, 2017

(54) SYSTEM AND METHOD FOR FULLY PHASE-ENCODED MAGNETIC RESONANCE IMAGING USING MULTIBAND RADIO FREQUENCY EXCITATION

(71) Applicant: Wisconsin Alumni Research Foundation, Madison, WI (US)

(72) Inventors: Matthew Robert Smith, Verona, WI (US); Nathan Samuel Artz, Sun Prairie, WI (US); Scott Brian Reeder, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 538 days.

(21) Appl. No.: 14/161,308

(22) Filed: Jan. 22, 2014

(65) Prior Publication Data
US 2015/0204957 A1 Jul. 23, 2015

(51) Int. Cl.
| | | |
|---|---|---|
| *G01V 3/00* | (2006.01) | |
| *G01R 33/44* | (2006.01) | |
| *G01R 33/483* | (2006.01) | |
| *G01R 33/565* | (2006.01) | |
| G01R 33/48 | (2006.01) | |

(52) U.S. Cl.
CPC ....... *G01R 33/446* (2013.01); *G01R 33/4835* (2013.01); *G01R 33/56536* (2013.01); *G01R 33/4822* (2013.01)

(58) Field of Classification Search
USPC ....................................................... 324/309
See application file for complete search history.

(56) References Cited

U.S. PATENT DOCUMENTS

| | | | | |
|---|---|---|---|---|
| 5,089,784 A | * | 2/1992 | Yoshitome | G01R 33/56 324/309 |
| 5,570,019 A | * | 10/1996 | Moonen | G01R 33/4833 324/307 |
| 6,366,090 B1 | * | 4/2002 | Heid | G01R 33/5615 324/307 |
| 7,307,420 B2 | * | 12/2007 | Dumoulin | G01R 33/287 324/307 |
| 9,360,542 B2 | * | 6/2016 | Reeder | G01R 33/485 |
| 2004/0100258 A1 | * | 5/2004 | Gurr | G01R 33/5607 324/307 |

(Continued)

OTHER PUBLICATIONS

Artz, et al., Spectrally Resolved Fully Phase-Encoded Three-Dimensional Fast Spin-Echo Imaging, First Published Online on Mar. 11, 2013, Magnetic Resonance in Medicine, DOI: 10.1002/mrm. 24704, 10 pages; Print: 2014, 71(2):681-690.

(Continued)

*Primary Examiner* — Rodney Fuller
(74) *Attorney, Agent, or Firm* — Quarles & Brady, LLP

(57) ABSTRACT

Systems and methods for simultaneously acquiring three-dimensional data from multiple different frequency bins with a magnetic resonance imaging ("MRI") system, and without frequency-encoding gradients, are provided. A multiband radio frequency ("RF") pulse is used to excite spins associated with multiple different resonance frequency offsets, and a fully phase-encoded acquisition is used to acquire data, which may be spectrally-resolved data, from magnetic resonance signals formed in response to the multiband RF pulse.

55 Claims, 3 Drawing Sheets

(56) References Cited

U.S. PATENT DOCUMENTS

| | | | | |
|---|---|---|---|---|
| 2006/0139027 A1* | 6/2006 | Dreher | ............... | G01R 33/485 |
| | | | | 324/307 |
| 2012/0056620 A1* | 3/2012 | Feinberg | ............ | G01R 33/4835 |
| | | | | 324/309 |
| 2013/0278254 A1* | 10/2013 | Reeder | ............ | G01R 33/56563 |
| | | | | 324/307 |
| 2014/0043023 A1 | 2/2014 | Reeder et al. | | |
| 2016/0154080 A1* | 6/2016 | Wiens | ............. | G01R 33/56536 |
| | | | | 324/309 |

OTHER PUBLICATIONS

Auerbach, et al., Multi-Band Accelerated Spin-Echo Echo Planar Imaging With Reduced Peak RF Power Using Time-Shifted RF Pulses, Magnetic Resonance in Medicine, 2013, 69(5):1261-1267.

Breuer, et al., Controlled Aliasing in Parallel Imaging Results in Higher Acceleration (CAIPIRINHA) for Multi-Slice Imaging, Magnetic Resonance in Medicine, 2005, 53:684-691.

Busse, et al., Fast Spin Echo Sequences With Very Long Echo Trains: Design of Variable Refocusing Flip Angle Schedules and Generation of Clinical T2 Contrast, Magnetic Resonance in Medicine, 2006, 55:1030-1037.

Griswold, et al., Generalized Autocalibrating Partially Parallel Acquisitions (GRAPPA). Magnetic Resonance in Medicine, 2002, 47:1202-1210.

Hayter, et al., Magnetic Resonance Imaging of the Postoperative Hip, Journal of Magnetic Resonance Imaging, 2012, 35:1013-1025.

Koch, et al., A Multispectral Three-Dimensional Acquisition Technique for Imaging Near Metal Implants, Magnetic Resonance in Medicine, 2009, 61(2):381-390.

Koch, et al., Magnetic Resonance Imaging Near Metal Implants, Journal of Magnetic Resonance Imaging, 2010, 32:773-787.

Koch, et al., Frequency Encoding in the Presence of Extreme Static Field Gradients, Proc. Intl. Soc. Mag. Reson. Med., 2011, 19:293.

Koch, et al., Imaging Near Metal: The Impact of Extreme Static Local Field Gradients on Frequency Encoding Processes, Magnetic Resonance in Medicine, 2014, 71(6):2024-2034.

Kurtz, et al., Prevalence of Primary and Revision Total Hip and Knee Arthroplasty in the United States from 1990 Through 2002, J. Bone Joint Surg. Am., 2005, 87-A(7):1487-1497.

Kurtz, et al., Projections of Primary and Revision Hip and Knee Arthroplasty in the United States From 2005 to 2030, J. Bone Joint Surg. Am., 2007, 89:780-785.

Larson, et al., Multiband Excitation Pulses for Hyperpolarized 13C Dynamic Chemical-Shift Imaging, Journal of Magnetic Resonance, 2008, 194:121-127.

Lu, et al., SEMAC: Slice Encoding for Metal Artifact Correction in MRI, Magnetic Resonance in Medicine, 2009, 62:66-76.

Muller, Multifrequency Selective rf Pulses for Multislice MR Imaging, Magnetic Resonance in Medicine, 1988, 6(3):364-371.

Smith, et al., Accelerating Sequences in the Presence of Metal by Exploiting the Spatial Distribution of Off-Resonance, Magnetic Resonance in Medicine, 2014, 72:1658-1667.

\* cited by examiner

SYSTEM AND METHOD FOR FULLY PHASE-ENCODED MAGNETIC RESONANCE IMAGING USING MULTIBAND RADIO FREQUENCY EXCITATION

STATEMENT REGARDING FEDERALLY SPONSORED RESEARCH

This invention was made with government support under DK083380 and DK088925 awarded by the National Institutes of Health. The government has certain rights in the invention.

CROSS-REFERENCE TO RELATED APPLICATIONS

N/A

BACKGROUND OF THE INVENTION

The field of the invention is systems and methods for magnetic resonance imaging ("MRI"). More particularly, the invention relates to systems and methods for fully phase-encoded three-dimensional MRI using multiband radio frequency ("RF") excitation without using frequency-encoding gradients.

Magnetic resonance imaging ("MRI") of non-ferrous metallic implants is challenging because of the substantial inhomogeneity induced in the $B_0$ magnetic field of the MRI system. This inhomogeneity leads to severe off-resonance in nearby tissue, causing signal loss and image distortion when using conventional spatial-encoding mechanisms. The image artifacts resulting from the off-resonance can significantly degrade the diagnostic quality of an image, making clinical diagnoses in the presence of metal very challenging.

This extreme off-resonance is problematic for conventional MRI applications for at least two reasons. First, the spectrum of off-resonance induced by metallic objects, such as metallic implants, is often so wide that it is impossible to excite the full spectrum of frequencies with a single RF pulse. Second, frequency-encoding in areas of extreme off-resonance can lead to signal pile-up and signal loss because the spatial encoding assumptions are violated.

Recently, new methods, such as slice-encoding for metal artifact correction ("SEMAC") and multi-acquisition variable-resonance image combination ("MAVRIC"), have been developed in an attempt to mitigate the off-resonance artifacts surrounding metallic implants. These methods are described, for example, by K. M. Koch, et al., in "Magnetic Resonance Imaging Near Metal Implants," *J Magn Reson Imaging*, 2010; 32(4):773-787.

MAVRIC and SEMAC techniques utilize frequency-encoding gradients (e.g., readout gradients) for spatial localization, which limits the ability of these methods for performing MRI near metal. When the local $B_0$ gradients near metal exceed the readout gradient, signal loss and pile-up are inevitable with frequency-encoding. This phenomenon is described by K. M. Koch, et al. in "Imaging Near Metal: The Impact of Extreme Static Local Field Gradients on Frequency Encoding Processes," *Magn Reson Med*, 2013; Jul. 10 doi: 10.1002/mrm.24862. [Epub ahead of print].

Fully phase-encoded ("FPE") imaging techniques eliminate frequency-encoding gradients by encoding k-space one point at a time. Previously, FPE techniques were proposed in an effort to produce distortion-free images in the presence of off-resonance. This effort, however, has not gained traction because of the prohibitively long scan times associated with FPE methods. A recent FPE method that is capable of spectrally-resolved, purely phase-encoded ("SR-FPE") three-dimensional acquisitions was recently proposed, as described in co-pending U.S. patent application Ser. No. 13/451,773, filed on Apr. 20, 2012, entitled "System and Method for Spectrally-Resolved Three-Dimensional Magnetic Resonance Imaging Without Frequency-Encoding Gradients," and which is herein incorporated by reference in its entirety.

Feasibility for reducing a four hour SR-FPE scan to twelve minutes using parallel imaging in all three spatial dimensions (as opposed to using parallel imaging in only two directions, as is the current convention) was demonstrated for a single RF offset by N. S. Artz, et al., in "Spectrally Resolved Fully Phase-Encoded Three-Dimensional Fast Spin-Echo Imaging," *Magn Reson Med.*, 2013; Mar. 11. doi: 10.1002/mrm.24704. [Epub ahead of print]. However, similar to MAVRIC and SEMAC, multiple three-dimensional acquisitions at distinct RF offsets will be required to excite the full spectrum of off-resonance for most metallic implants, requiring an increase in scan time that may be clinically prohibitive.

Thus, there remains a need for a system and method for magnetic resonance imaging that is capable of accelerating data acquisitions that require multiple RF offsets due to severe off-resonances, such as those caused by magnetic field inhomogeneities induced by a metallic object.

SUMMARY OF THE INVENTION

The present invention overcomes the aforementioned drawbacks by providing a system and method for performing spectrally-resolved three-dimensional magnetic resonance imaging ("MRI") using multiband radio frequency ("RF") excitation to simultaneously excites spins associated with multiple different resonance frequency offsets.

It is an aspect of the invention to provide a method for simultaneously acquiring three-dimensional data from multiple different resonance frequency offsets with an MRI system. The MRI system is directed to produce a multiband RF pulse that excites spins associated with each of a plurality of different resonance frequency offsets. The MRI system is also directed to establish a first phase-encoding gradient along a first direction, a second phase-encoding gradient along a second direction that is orthogonal to the first direction, and a third phase-encoding gradient along a third direction that is orthogonal to the first direction and the second direction. Data are acquired at a point in k-space that is defined by the first, second, and third phase-encoding gradients by sampling a magnetic resonance signal during a period of time in which no magnetic field gradients are established by the MRI system.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
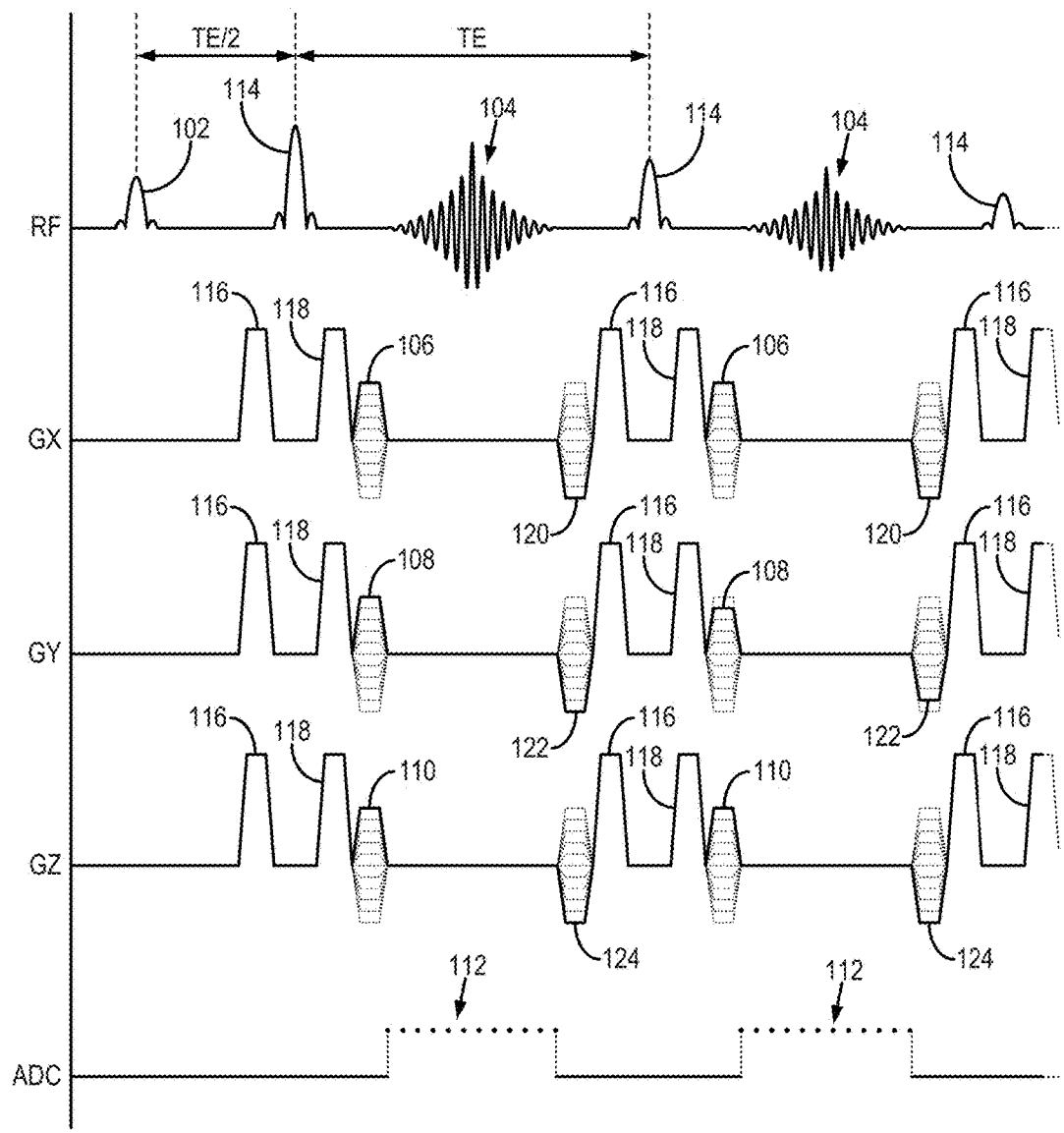
FIG. 1 is an example of a pulse sequence that phase-encodes a magnetic resonance signal, such as spin-echo and stimulated-echo signals, in three dimensions and that does not include a frequency-encoding gradient.

Described here are systems and methods for spectrally-resolved three-dimensional magnetic resonance imaging ("MRI") in which multiple different spectral bands associated with multiple different resonance frequency offsets are simultaneously excited using a multiband excitation scheme. The magnetic resonance signals generated in response to this excitation are then spatially encoded using phase-encoding along three spatial dimensions (i.e., no frequency-encoding gradients are used). As such, the imaging technique can be referred to as being multiband, fully phase-encoded ("MB-FPE") imaging.

This approach has the benefit of reducing scan time for MRI methods, generally, and MB-FPE methods in particular. Alternatively, instead of minimizing scan time, a greater off-resonance spectrum could be excited and imaged using the present invention. This alternative application can improve visualization of tissues within a close proximity to a metallic object, such as a metal implant, where off-resonance is the greatest. By way of example, the systems and methods of the present invention can provide substantially distortion-free imaging near metal, which can enable evaluation of complications due to implanted metallic prostheses (e.g., hip/knee/shoulder replacements, rods, screws, plates).

Multiband imaging techniques have been previously applied to simultaneous multislice acquisitions, as described, for example, by S. Müller in "Multifrequency Selective RF Pulses for Multislice MR Imaging," *Magn Reson Med*, 1988; 6: 364-371. Multiband imaging has also been applied to hyperpolarized carbon-13 MRI to simultaneously excite and acquire multiple metabolic components, as described, for example, by P. Larson in "Multiband excitation pulses for hyperpolarized $^{13}$C dynamic chemical-shift imaging," *Magn Reson Med*, 2008; 194(1):121-127. In these examples, and all prior uses of a multiple-band RF excitation, the spatial distortion resulting from frequency encoding is considered sub-pixel because of the relatively small off-resonance of hundreds of Hertz (Hz).

When imaging near metallic implants with frequency encoding, however, the metal induces the off-resonance. If different frequency bands are excited near metal using multiband excitation, the off-resonance bands will remain off-resonant throughout frequency encoding, which destroys the spatial encoding process and leads to significant undesirable image artifacts. Thus, current methods for imaging near metal, such as MAVRIC and SEMAC, that make use of frequency-encoding gradients have been limited to using single band RF pulses.

The systems and methods of the present invention make use of multiband excitation to accelerate imaging near metal, which is more straightforward when frequency encoding is eliminated and FPE spatial encoding techniques are implemented instead.

There are two main aspects to consider when applying multiband excitations to FPE techniques. First, the receiver bandwidth is preferably increased to capture the range of excited frequencies. As an example, if the multiband RF excitation bandwidth excites frequencies between ±7.81 kHz, then a matching receiver bandwidth of ±7.81 kHz can be used. Without additional processing, described below, this increased receiver bandwidth results in a reduction in signal-to-noise ratio ("SNR").

Second, for a given flip angle, conventional multiband pulses require a higher peak $B_1$ strength (e.g., because exciting three frequency bands normally increases the peak $B_1$ threefold). The increased power requirement limits the flip angles that can be achieved for a given peak $B_1$. Varying the phase between the band waveforms in the time domain, and/or shifting the bands in time prior to performing the complex sum, however, allows for multiband pulses with lower peak $B_1$ values that are more comparable to single band pulses. It may also provide a way to improve spectral decomposition and/or digital filtering of the frequency bands that could benefit acceleration mechanisms, such as a spatial-encoding technique that exploits the spatial dependence of the off-resonances that occur for spins precessing in the presence of magnetic field inhomogeneities to provide spatially-dependent spectral sensitivity information. In such a technique, the spectral sensitivity information provided by the off-resonances can be used during image reconstruction to provide spatial-encoding of acquired magnetic resonance signals. Such an off-resonance encoding technique is described, for example, in U.S. patent application Ser. No. 13/568,511, which is herein incorporated by reference in its entirety.

In general, the systems and methods of the present invention allow for independent and highly customizable sampling of k-space. Each spatially-encoded magnetic resonance signal can be sampled at multiple time points, thereby providing the acquisition of spectrally-resolved data. Because each magnetic resonance signal is independently sampled, a significant gain in SNR can be achieved over many existing imaging techniques. In addition, spectral data can be efficiently acquired at spatial resolutions common to conventional MRI techniques.

The method of the present invention may be implemented using any number of different pulse sequences. For example, the method of the present invention may be implemented in a three-dimensional pulse sequence that samples a magnetic resonance signal in the form of a free-induction decay, spin echo, or stimulated echo. Additionally, the present invention may be implemented using a three-dimensional pulse sequence that utilizes coherent transverse magnetization from one repetition time period to the next, including gradient-recalled acquisition in the steady-state ("GRASS") and steady-state free precession ("SSFP") pulse sequences.

By way of example, a three-dimensional pulse sequence that acquires k-space data by sampling spin-echo magnetic resonance signals is illustrated in FIG. 1. Such a pulse sequence may include a spectrally-resolved fast spin-echo pulse sequence. Because, in this pulse sequence, no frequency-encoding gradient is played out during the formation of the magnetic resonance signal, frequency-encoding-related shift artifacts are avoided. By way of further example, the pulse sequence may include using an excitation scheme with extended refocusing trains using modulated flip angles, an example of which is described by R. F. Busse, et al., in "Fast Spin Echo Sequences with Very Long Echo Trains: Design of Variable Refocusing Flip Angle Schedules and Generation of Clinical T2 Contrast," *Magnetic Resonance in Medicine*, 2006; 55(5): 1030-1037.

Referring now to FIG. 1, an example of a pulse sequence for acquiring three-dimensional k-space data with a multiband excitation that excites multiple different spectral bands and without the use of a frequency-encoding gradient is illustrated. In this example, the pulse sequence is a three-dimensional fast-spin echo pulse sequence. The pulse sequence includes the application of a multiband radio frequency ("RF") excitation pulse 102 that acts to rotate net magnetization in multiple different resonance frequency bins about an axis. For instance, the multiband RF excitation pulse 102 is configured to rotate net magnetization about a rotation axis into a transverse plane such that the net magnetization is converted from longitudinal magnetization into transverse magnetization in each of the frequency bins.

As one example, the multiband RF excitation pulse 102 can be designed to simultaneously excite three frequency bands with different center-frequency offsets, such as: −4000 Hz, 0 Hz, and 4000 Hz (i.e., one frequency band on-resonance and two frequency bands that are off-resonance with a ±4000 Hz offset). To reduce the peak $B_1$ of the multiband RF excitation pulse 102, a temporal phase difference, temporal shift, or both can be added to one of the three frequency bands prior to summing.

After the multiband RF excitation pulse 102 is applied, an RF refocusing pulse 114 is applied in order to refocus dephasing of the transverse magnetization and to form spin-echo magnetic resonance signals 104. The RF refocusing pulse 114 is preferably a multiband RF pulse designed to refocus spins in the same multiple resonance frequency bins that were excited by the multiband RF excitation pulse 102. In a pulse sequence where multiple spin-echoes are generated for each RF excitation, it may be advantageous to modulate the flip angle of subsequent RF refocusing pulses 114.

The magnetic resonance signals 104 are spatially-encoded by the application of three phase encoding gradients 106, 108, 110. The first phase-encoding gradient 106 is applied along a first direction, such as the x-direction. The second phase-encoding gradient 108 is established concurrently with the first phase-encoding gradient 106 and is applied along a second direction, such as the y-direction, that is orthogonal to the first direction. The third phase-encoding gradient 110 is established concurrently with the first and second phase-encoding gradients 106, 108 and is applied along a third direction, such as the z-direction, that is orthogonal to the first and second directions. Together, the three phase-encoding gradients 106, 108, 110 spatially-encode the magnetic resonance signals 104. For example, the three phase-encoding gradients 106, 108, 110 define a single point in three-dimensional k-space at which the magnetic resonance signals 104 will be sampled during a data acquisition window 112. Each magnetic resonance signal 104 may be symmetrically sampled through time to provide spectral decomposition and high signal-to-noise ratio ("SNR") performance.

To help ensure that the magnetic resonance signals are in-phase, crusher gradients 116 may be applied before each RF refocusing pulse 114. These crusher gradients 116 act as prewinders. To mitigate free-induction decay signals generated by the RF refocusing pulse 114, crusher gradients 118 may also be applied after the RF refocusing pulse 114. These crusher gradients 116, 118 may not be needed when only a single spin-echo is sampled following RF excitation. It is noted that although the crusher gradients 118 and phase encoding gradients 106, 108, 110 are shown as distinct gradient pulses, in practice these gradient may be combined. After each magnetic resonance signal 104 is formed and sampled, rewinding phase-encoding gradients 120, 122, and 124 are generated before spatially-encoding the next magnetic resonance signals in the echo train.

The echo train of this pulse sequence is repeated a plurality of times and during each repetition one or more of the three phase-encoding gradients 106, 108, 110 is changed so that a different point in three-dimensional k-space is sampled for each subsequent magnetic resonance signal 104 formed in the echo train. By way of example, the amplitude of the three phase-encoding gradients 106, 108, 110 may be stepped through a plurality of values such that k-space is sampled in a sampling pattern defined by the amplitudes of the phase-encoding gradients 106, 108, 110.

In some embodiments, each point in k-space can be repeatedly sampled over a period of time when the magnetic resonance signals 104 are generated. As a result the sampling used in these embodiments, each sampled point in k-space will contain information for N different images, where N is the number of time points at which the magnetic resonance signals 104 are sampled at any given point in k-space. This independent sampling yields a significant gain in SNR and can also provide unique spectral information. This spectral information can be used to separate the multiple RF frequency bands (excited using an MB pulse) via digital filtering and/or spectral decomposition. Although MB imaging requires a larger receiver bandwidth during acquisition, subsequent digital filtering of the spectral data yields SNR comparable to a single RF band acquisition, in which data would be acquired with a smaller receiver bandwidth. It is also contemplated that this SNR enhancement can facilitate other acceleration mechanisms, such as the off-resonance encoding discussed and referenced above.

Figure 2:
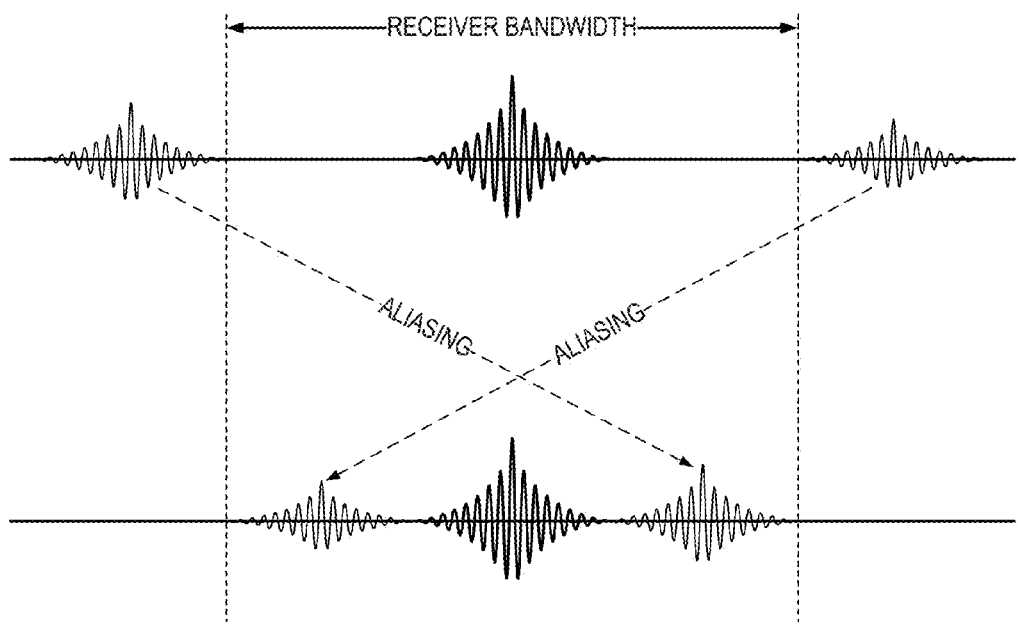
FIG. 2 is an illustration of selecting a readout bandwidth such that signals generated by exciting unique frequency bands with a multiband pulse are aliased so as not to overlap with signals from other frequency bins.

An alternative method for reducing the effective receiver bandwidth includes using a readout bandwidth that is chosen to be smaller than the MB RF excitation bandwidth, such that the signal at the frequencies outside of the readout bandwidth will alias. As illustrated in FIG. 2, if unique frequency bands are excited with a multiband pulse, then the readout bandwidth can be selected such that the aliased signals would not overlap into the signal from other frequency bins. Using this approach, multiple frequency bands can be simultaneously acquired while minimizing the size of the readout bandwidth, thereby improving SNR.

When a multiband excitation is used to acquire signals for each of N different frequency bands in a single acquisition, an N-fold reduction in scan time may be achievable. As noted above, as one example, N may equal three, meaning that three different frequency bands can be acquired in a single acquisition. It should be noted that additional techniques can also be implemented to accelerate data acquisition. For example, corner cutting in three dimensions can be used to accelerate data acquisition by not sampling the corner regions of k-space, thereby providing R=2 acceleration. Further, if parallel imaging techniques are utilized in all three phase-encoded dimensions, even greater acceleration factors can be achieved. As one example, with three-fold acceleration in the x-direction, and two-fold acceleration in the y-direction and z-direction, a net acceleration factor of R=3×2×2=12 is feasible. Coupling a multiband acquisition with an R=2 acceleration from corner cutting, described above, and an R=12 acceleration using parallel imaging in three dimensions, also described above, a total acceleration of R=3×2×12=72 may be achievable.

Data acquired with pulse sequences that implement the present invention can be reconstructed to produce images of the subject using existing image reconstruction techniques. For example, when data are acquired by sampling k-space at points that lie on a three-dimensional Cartesian grid, images can be reconstructed using a convention Fourier transform ("FT") approach. Other image reconstruction techniques may also be used depending on the choice of k-space sampling pattern. For example, backprojection methods, regridding methods with subsequent FT, compressed-sensing based methods, and parallel image reconstruction methods, such as GRAPPA, may be used.

Pulse sequences that implement the present invention can use a standard FT applied along the time dimension on a voxel-by-voxel basis to produce spectroscopic images. Alternatively, signal modeling can be used to estimate the proton density, p; transverse magnetization relaxation rate, $R^*_2$; and $B_0$ field map, $\psi$, at each voxel. This signal model can also incorporate multiple chemical species, thereby allowing for separation of the signal contributions of the chemical species, such as in water-fat separation. A magnetic resonance signal for a single chemical species can be modeled as $$S_n(r) = \rho(r)e^{-R^*_2(r)|t_n|}e^{i2\pi\psi(r)t_n}; \quad (1)$$

and a magnetic resonance signal for M different chemical species can be modeled as $$S_n(r) = e^{i2\pi\psi(r)t_n}\sum_{m=1}^{M}\rho_m(r)e^{i2\pi\Delta f_m(r)t_n}e^{-R^*_{2,m}(r)|t_n|}; \quad (2)$$

where $S_n(r)$ is the signal measured for a voxel, r; $t_n$ is the time of a sample, n, relative to the spin-echo or the start of the free-induction decay; $\rho(r)$ is proton density at the voxel, r; $\Delta f$ is the frequency offset from water; and $\psi(r)$ represents the magnetic field, $B_0$, at the voxel, r. Using a non-linear least squares, or other, curve fitting algorithm, $\rho(r)$, $\psi(r)$, and $R^*_2(r)$ can be estimated from Eqns. (1) or (2).

Figure 3:
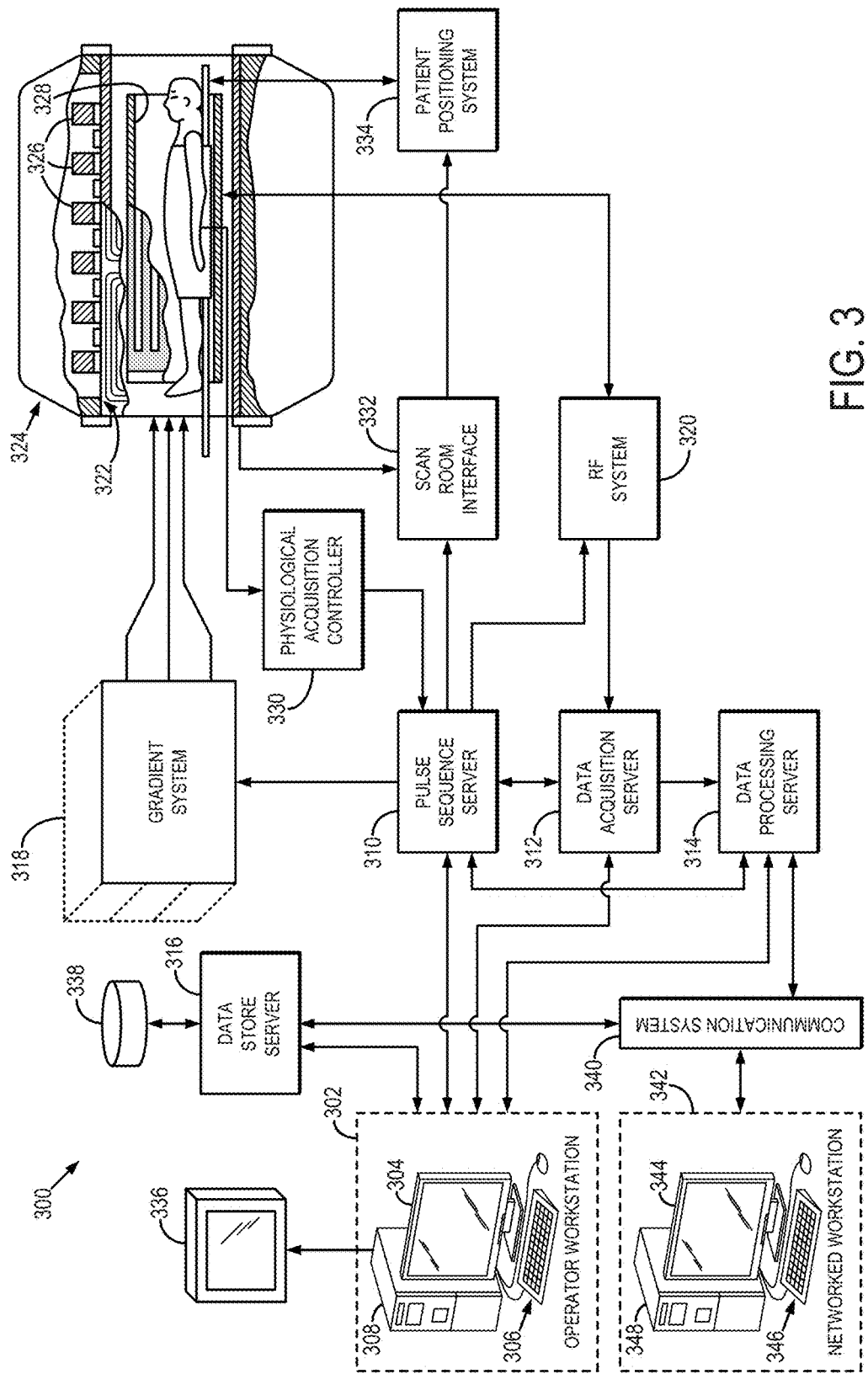
FIG. 3 is a block diagram of an example of a magnetic resonance imaging ("MRI") system.

Referring particularly now to FIG. 3, an example of a magnetic resonance imaging ("MRI") system 300 is illustrated. The MRI system 300 includes an operator workstation 302, which will typically include a display 304; one or more input devices 306, such as a keyboard and mouse; and a processor 308. The processor 308 may include a commercially available programmable machine running a commercially available operating system. The operator workstation 302 provides the operator interface that enables scan prescriptions to be entered into the MRI system 300. In general, the operator workstation 302 may be coupled to four servers: a pulse sequence server 310; a data acquisition server 312; a data processing server 314; and a data store server 316. The operator workstation 302 and each server 310, 312, 314, and 316 are connected to communicate with each other. For example, the servers 310, 312, 314, and 316 may be connected via a communication system 340, which may include any suitable network connection, whether wired, wireless, or a combination of both. As an example, the communication system 340 may include both proprietary or dedicated networks, as well as open networks, such as the internet.

The pulse sequence server 310 functions in response to instructions downloaded from the operator workstation 302 to operate a gradient system 318 and a radiofrequency ("RF") system 320. Gradient waveforms necessary to perform the prescribed scan are produced and applied to the gradient system 318, which excites gradient coils in an assembly 322 to produce the magnetic field gradients $G_x$, $G_y$, and $G_z$ used for position encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil (not shown in FIG. 3), in order to perform the prescribed magnetic resonance pulse sequence. Responsive magnetic resonance signals detected by the RF coil 328, or a separate local coil (not shown in FIG. 3), are received by the RF system 320, where they are amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the scan prescription and direction from the pulse sequence server 310 to produce RF pulses of the desired frequency, phase, and pulse amplitude waveform. The generated RF pulses may be applied to the whole-body RF coil 328 or to one or more local coils or coil arrays (not shown in FIG. 3).

The RF system 320 also includes one or more RF receiver channels. Each RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \quad (3);$$

and the phase of the received magnetic resonance signal may also be determined according to the following relationship:

$$\varphi = \tan^{-1}\left(\frac{Q}{I}\right). \quad (4)$$

The pulse sequence server 310 also optionally receives patient data from a physiological acquisition controller 330. By way of example, the physiological acquisition controller 330 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 310 to synchronize, or "gate," the performance of the scan with the subject's heart beat or respiration.

The pulse sequence server 310 also connects to a scan room interface circuit 332 that receives signals from various sensors associated with the condition of the patient and the magnet system. It is also through the scan room interface circuit 332 that a patient positioning system 334 receives commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, such that no data is lost by data overrun. In some scans, the data acquisition server 312 does little more than pass the acquired magnetic resonance data to the data processor server 314. However, in scans that require information derived from acquired magnetic resonance data to control the further performance of the scan, the data acquisition server 312 is programmed to produce such information and convey it to the pulse sequence server 310. For example, during prescans, magnetic resonance data is acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also be employed to process magnetic resonance signals used to detect the arrival of a contrast agent in a magnetic resonance angiography ("MRA") scan. By way of example, the data acquisition server 312 acquires magnetic resonance data and processes it in real-time to produce information that is used to control the scan.

The data processing server 314 receives magnetic resonance data from the data acquisition server 312 and processes it in accordance with instructions downloaded from the operator workstation 302. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 314 are conveyed back to the operator workstation 302 where they are stored. Real-time images are stored in a data base memory cache (not shown in FIG. 3), from which they may be output to operator display 312 or a display 336 that is located near the magnet assembly 324 for use by attending physicians. Batch mode images or selected real time images are stored in a host database on disc storage 338. When such images have been reconstructed and transferred to storage, the data processing server 314 notifies the data store server 316 on the operator workstation 302. The operator workstation 302 may be used by an operator to archive the images, produce films, or send the images via a network to other facilities.

The MRI system 300 may also include one or more networked workstations 342. By way of example, a networked workstation 342 may include a display 344; one or more input devices 346, such as a keyboard and mouse; and a processor 348. The networked workstation 342 may be located within the same facility as the operator workstation 302, or in a different facility, such as a different healthcare institution or clinic.

The networked workstation 342, whether within the same facility or in a different facility as the operator workstation 302, may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may exchanged between the data processing server 314 or the data store server 316 and the networked workstations 342, such that the data or images may be remotely processed by a networked workstation 342. This data may be exchanged in any suitable format, such as in accordance with the transmission control protocol ("TCP"), the internet protocol ("IP"), or other known or suitable protocols.

Thus, a system and method for using multiband excitation with fully-phase encoded methods, such as MB-FPE, to simultaneously excite multiple frequency bands near metallic implants, to thereby reduce scan time, have been provided. It is also contemplated that using multiband RF with MAVRIC or SEMAC can be implemented by exciting narrow frequency bands (e.g., 300 Hz) with small offsets (e.g., 400 Hz), and/or by digitally filtering the acquired data to distinguish different spectral bands.

The present invention has been described in terms of one or more preferred embodiments, and it should be appreciated that many equivalents, alternatives, variations, and modifications, aside from those expressly stated, are possible and within the scope of the invention.

What is claimed is:

1. A method for simultaneously acquiring three-dimensional data from multiple different resonance frequency offsets with a magnetic resonance imaging system, the steps of the method comprising:
   directing the MRI system to:
   a) produce a multiband radio frequency (RF) pulse that excites spins associated with each of a plurality of different resonance frequency offsets;
   b) establish a first phase-encoding gradient along a first direction;
   c) establish a second phase-encoding gradient along a second direction that is orthogonal to the first direction;
   d) establish a third phase-encoding gradient along a third direction that is orthogonal to the first direction and the second direction;
   e) acquire data at a point in k-space that is defined by the first, second, and third phase-encoding gradients by sampling a magnetic resonance signal during a period of time in which no magnetic field gradients are established by the MRI; and
   wherein the plurality of different resonance frequency offsets includes an on-resonance frequency and at least one off-resonance frequency.

2. The method as recited in claim 1, wherein the plurality of different frequency offsets comprises a plurality of frequency bins each spanning a range of frequencies.

3. The method as recited in claim 2, wherein the plurality of frequency bins includes at least two frequency bins spanning distinct ranges of frequencies.

4. The method as recited in claim 1, wherein the MRI system is further directed to produce a multiband refocusing RF pulse that refocuses magnetization attributable to the excited spins associated with each of the plurality of resonance frequency offsets so as to form the magnetic resonance signal as a spin-echo at an echo time.

5. The method as recited in claim 1, wherein the magnetic resonance signal is at least one of a free-induction decay signal, a spin-echo signal, and a stimulated echo signal.

6. The method as recited in claim 1, wherein the MRI system is directed to repeat steps a)-e) a plurality of times while each repetition alters at least one of the first, second, and third phase-encoding gradients such that data are acquired from a different point in k-space during each repetition, the different points in k-space defining a k-space sampling pattern.

7. The method as recited in claim 6 in which the k-space sampling pattern includes at least one of sampling k-space at points on a Cartesian grid, sampling k-space at points along radial lines, sampling k-space at points along spiral trajectories, and sampling k-space at points that are randomly distributed in three-dimensional k-space.

8. The method as recited in claim 6 in which the k-space sampling pattern includes a variable density of sampling points such that different portions of k-space are sampled with different sampling densities.

9. The method as recited in claim 6 in which the k-space sampling pattern is designed such that undersampling occurs along at least one of the first direction, the second direction, and the third direction.

10. The method as recited in claim 9 in which the k-space sampling pattern is designed such that undersampling occurs along each of the first direction, the second direction, and the third direction.

11. The method as recited in claim 6 in which the k-space sampling pattern is arbitrary and an order in which the different k-space points defining the k-space sampling pattern are selected is arbitrary.

12. The method as recited in claim 6, further comprising reconstructing an image from the data acquired in step e) using at least one of a parallel imaging reconstruction, a compressed sensing reconstruction, a partial Fourier reconstruction, a constrained reconstruction, and combinations thereof.

13. The method as recited in claim 6, further comprising reconstructing an image from the data acquired in step e) and wherein the data acquired in step e) are spectrally-resolved and the spectrally-resolved data are spectrally decomposed prior to reconstructing the image, thereby providing further separation of frequency bins associated with plurality of resonance frequency offsets.

14. The method as recited in claim 13, wherein the spectrally-resolved data are spectrally decomposed by fitting the spectrally-resolved data to a signal model that models magnetic resonance signals associated with at least one chemical species.

15. The method as recited in claim 6, further comprising reconstructing an image from the data acquired in step e) and wherein the data acquired in step e) are spectrally-resolved and the spectrally-resolved data are filtered prior to reconstructing the image in order to reduce unnecessary noise and to provide further separation of frequency bins associated with the plurality of different resonance frequency offsets.

16. The method as recited in claim 15, wherein the data are filtered using a passband filter with passbands associated with the plurality of different resonance frequency offsets.

17. The method as recited in claim 1, wherein step a) includes varying a phase of the multiband RF pulse for each of the plurality of resonance frequency offsets.

18. The method as recited in claim 1, wherein step a) includes using a different temporal shift in the multiband RF pulse for each of the plurality of resonance frequency offsets.

19. The method as recited in claim 1, wherein step e) includes acquiring the data using a readout bandwidth having a size that avoids an overlap of aliased signals attributable to frequency bands outside of the readout bandwidth.

20. A method for simultaneously acquiring three-dimensional data from multiple different resonance frequency offsets with a magnetic resonance imaging system, the steps of the method comprising:
    directing the MRI system to:
    a) produce a multiband radio frequency (RF) pulse that excites spins associated with each of a plurality of different resonance frequency offsets;
    b) establish a first phase-encoding gradient along a first direction;
    c) establish a second phase-encoding gradient along a second direction that is orthogonal to the first direction;
    d) establish a third phase-encoding gradient along a third direction that is orthogonal to the first direction and the second direction;
    e) acquire data at a point in k-space that is defined by the first, second, and third phase-encoding gradients by sampling a magnetic resonance signal during a period of time in which no magnetic field gradients are established by the MRI system; and
    wherein the plurality of different frequency offsets comprises a plurality of frequency bins each spanning a range of frequencies.

21. The method as recited in claim 20, wherein the plurality of different resonance frequency offsets includes an on-resonance frequency and at least one off-resonance frequency.

22. The method as recited in claim 20, wherein the plurality of frequency bins includes at least two frequency bins spanning distinct ranges of frequencies.

23. The method as recited in claim 20, wherein the MRI system is further directed to produce a multiband refocusing RF pulse that refocuses magnetization attributable to the excited spins associated with each of the plurality of resonance frequency offsets so as to form the magnetic resonance signal as a spin-echo at an echo time.

24. The method as recited in claim 20, wherein the magnetic resonance signal is at least one of a free-induction decay signal, a spin-echo signal, and a stimulated echo signal.

25. The method as recited in claim 20, wherein the MRI system is directed to repeat steps a)-e) a plurality of times while each repetition alters at least one of the first, second, and third phase-encoding gradients such that data are acquired from a different point in k-space during each repetition, the different points in k-space defining a k-space sampling pattern.

26. The method as recited in claim 25 in which the k-space sampling pattern includes at least one of sampling k-space at points on a Cartesian grid, sampling k-space at points along radial lines, sampling k-space at points along spiral trajectories, and sampling k-space at points that are randomly distributed in three-dimensional k-space.

27. The method as recited in claim 25 in which the k-space sampling pattern includes a variable density of sampling points such that different portions of k-space are sampled with different sampling densities.

28. The method as recited in claim 25 in which the k-space sampling pattern is designed such that undersampling occurs along at least one of the first direction, the second direction, and the third direction.

29. The method as recited in claim 28 in which the k-space sampling pattern is designed such that undersampling occurs along each of the first direction, the second direction, and the third direction.

30. The method as recited in claim 25 in which the k-space sampling pattern is arbitrary and an order in which the different k-space points defining the k-space sampling pattern are selected is arbitrary.

31. The method as recited in claim 25 further comprising reconstructing an image from the data acquired in step e) using at least one of a parallel imaging reconstruction, a compressed sensing reconstruction, a partial Fourier reconstruction, a constrained reconstruction, and combinations thereof.

32. The method as recited in claim 25 further comprising reconstructing an image from the data acquired in step e) and wherein the data acquired in step e) are spectrally-resolved and the spectrally-resolved data are spectrally decomposed prior to reconstructing the image, thereby providing further separation of frequency bins associated with plurality of resonance frequency offsets.

33. The method as recited in claim 32, wherein the spectrally-resolved data are spectrally decomposed by fitting the spectrally-resolved data to a signal model that models magnetic resonance signals associated with at least one chemical species.

34. The method as recited in claim 25 further comprising reconstructing an image from the data acquired in step e) and wherein the data acquired in step e) are spectrally-resolved and the spectrally-resolved data are filtered prior to reconstructing the image in order to reduce unnecessary noise and to provide further separation of frequency bins associated with the plurality of different resonance frequency offsets.

35. The method as recited in claim 34 wherein the data are filtered using a passband filter with passbands associated with the plurality of different resonance frequency offsets.

36. The method as recited in claim 20, wherein step a) includes varying a phase of the multiband RF pulse for each of the plurality of resonance frequency offsets.

37. The method as recited in claim 20, wherein step a) includes using a different temporal shift in the multiband RF pulse for each of the plurality of resonance frequency offsets.

38. The method as recited in claim 20, wherein step e) includes acquiring the data using a readout bandwidth having a size that avoids an overlap of aliased signals attributable to frequency bands outside of the readout bandwidth.

39. A method for simultaneously acquiring three-dimensional data from multiple different resonance frequency offsets with a magnetic resonance imaging system, the steps of the method comprising:
   directing the MRI system to:
   a) produce a multiband radio frequency (RF) pulse that excites spins associated with each of a plurality of different resonance frequency offsets;
   b) establish a first phase-encoding gradient along a first direction;
   c) establish a second phase-encoding gradient along a second direction that is orthogonal to the first direction;
   d) establish a third phase-encoding gradient along a third direction that is orthogonal to the first direction and the second direction;
   e) acquire data at a point in k-space that is defined by the first, second, and third phase-encoding gradients by sampling a magnetic resonance signal during a period of time in which no magnetic field gradients are established by the MRI system; and
   at least one of:
      wherein step a) includes varying a phase of the multiband RF pulse for each of the plurality of resonance frequency offsets;
      wherein step a) includes using a different temporal shift in the multiband RF pulse for each of the plurality of resonance frequency offsets; or
      wherein step e) includes acquiring the data using a readout bandwidth having a size that avoids an overlap of aliased signals attributable to frequency bands outside of the readout bandwidth.

40. The method as recited in claim 39, wherein the plurality of different resonance frequency offsets includes an on-resonance frequency and at least one off-resonance frequency.

41. The method as recited in claim 39, wherein the plurality of different frequency offsets comprises a plurality of frequency bins each spanning a range of frequencies.

42. The method as recited in claim 41, wherein the plurality of frequency bins includes at least two frequency bins spanning distinct ranges of frequencies.

43. The method as recited in claim 39, wherein the MRI system is further directed to produce a multiband refocusing RF pulse that refocuses magnetization attributable to the excited spins associated with each of the plurality of resonance frequency offsets so as to form the magnetic resonance signal as a spin-echo at an echo time.

44. The method as recited in claim 39, wherein the magnetic resonance signal is at least one of a free-induction decay signal, a spin-echo signal, and a stimulated echo signal.

45. The method as recited in claim 39, wherein the MRI system is directed to repeat steps a)-e) a plurality of times while each repetition alters at least one of the first, second, and third phase-encoding gradients such that data are acquired from a different point in k-space during each repetition, the different points in k-space defining a k-space sampling pattern.

46. The method as recited in claim 45 in which the k-space sampling pattern includes at least one of sampling k-space at points on a Cartesian grid, sampling k-space at points along radial lines, sampling k-space at points along spiral trajectories, and sampling k-space at points that are randomly distributed in three-dimensional k-space.

47. The method as recited in claim 45 in which the k-space sampling pattern includes a variable density of sampling points such that different portions of k-space are sampled with different sampling densities.

48. The method as recited in claim 45 in which the k-space sampling pattern is designed such that undersampling occurs along at least one of the first direction, the second direction, and the third direction.

49. The method as recited in claim 48 in which the k-space sampling pattern is designed such that undersampling occurs along each of the first direction, the second direction, and the third direction.

50. The method as recited in claim 45 in which the k-space sampling pattern is arbitrary and an order in which the different k-space points defining the k-space sampling pattern are selected is arbitrary.

51. The method as recited in claim 45 further comprising reconstructing an image from the data acquired in step e) using at least one of a parallel imaging reconstruction, a compressed sensing reconstruction, a partial Fourier reconstruction, a constrained reconstruction, and combinations thereof.

52. The method as recited in claim 45 further comprising reconstructing an image from the data acquired in step e) and wherein the data acquired in step e) are spectrally-resolved and the spectrally-resolved data are spectrally decomposed prior to reconstructing the image, thereby providing further separation of frequency bins associated with plurality of resonance frequency offsets.

53. The method as recited in claim 52 wherein the spectrally-resolved data are spectrally decomposed by fitting the spectrally-resolved data to a signal model that models magnetic resonance signals associated with at least one chemical species.

54. The method as recited in claim 45 further comprising reconstructing an image from the data acquired in step e) and wherein the data acquired in step e) are spectrally-resolved and the spectrally-resolved data are filtered prior to reconstructing the image in order to reduce unnecessary noise and to provide further separation of frequency bins associated with the plurality of different resonance frequency offsets.

55. The method as recited in claim 54 wherein the data are filtered using a passband filter with passbands associated with the plurality of different resonance frequency offsets.

* * * * *

UNITED STATES PATENT AND TRADEMARK OFFICE
CERTIFICATE OF CORRECTION

PATENT NO. : 9,594,134 B2  
APPLICATION NO. : 14/161308  
DATED : March 14, 2017  
INVENTOR(S) : Matthew Robert Smith et al.

Page 1 of 1

It is certified that error appears in the above-identified patent and that said Letters Patent is hereby corrected as shown below:

In the Claims

Column 10, Claim 1, Line 36, "MRI;" should be --MRI system;--.

Signed and Sealed this  
Sixteenth Day of May, 2017

Michelle K. Lee  
*Director of the United States Patent and Trademark Office*